(12) United States Patent
Sandhu et al.

(10) Patent No.: US 7,667,260 B2
(45) Date of Patent: Feb. 23, 2010

(54) NANOSCALE FLOATING GATE AND METHODS OF FORMATION

(75) Inventors: Gurtej S. Sandhu, Boise, ID (US); D. V. Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 11/501,525

(22) Filed: Aug. 9, 2006

(65) Prior Publication Data

US 2008/0035983 A1    Feb. 14, 2008

(51) Int. Cl.
  *H01L 21/336* (2006.01)
  *H01L 29/788* (2006.01)
  *H01L 21/8247* (2006.01)

(52) U.S. Cl. ............... 257/316; 438/264; 257/E21.422; 977/721; 977/762

(58) Field of Classification Search ......... 438/775–777, 438/257–267; 257/E51.038–E51.04, E23.074, 257/E23.165, 314–320, E21.68, E21.681, 257/E21.683, E21.686, E21.179, E21.422, 257/E39; 977/720, 721, 723, 742, 762
See application file for complete search history.

(56) References Cited

U.S. PATENT DOCUMENTS

| 5,328,810 | A   |   | 7/1994  | Lowrey et al. |       |
|-----------|-----|---|---------|---------------|-------|
| 6,320,784 | B1  | * | 11/2001 | Muralidhar et al. | 365/151 |
| 6,566,704 | B2  | * | 5/2003  | Choi et al.   | 257/314 |
| 6,740,928 | B2  | * | 5/2004  | Yoshii et al. | 257/315 |
| 6,773,616 | B1  |   | 8/2004  | Chen et al.   |       |
| 6,806,141 | B2  |   | 10/2004 | Kamins        |       |
| 6,858,891 | B2  |   | 2/2005  | Farnworth et al. |    |
| 6,991,984 | B2  | * | 1/2006  | Ingersoll et al. | 438/257 |
| 7,045,851 | B2  | * | 5/2006  | Black et al.  | 257/315 |
| 7,262,991 | B2  | * | 8/2007  | Zhang et al.  | 365/185.01 |
| 7,446,025 | B2  | * | 11/2008 | Cohen et al.  | 438/583 |
| 7,504,280 | B2  | * | 3/2009  | Khang et al.  | 438/99 |
| 7,517,747 | B2  | * | 4/2009  | Muralidhar et al. | 438/201 |
| 2003/0006475 | A1 | * | 1/2003 | Tseng        | 257/510 |
| 2003/0045082 | A1 | * | 3/2003 | Eldridge et al. | 438/593 |

(Continued)

FOREIGN PATENT DOCUMENTS

EP    1 091 392 A2    4/2001

(Continued)

OTHER PUBLICATIONS

X. B. Lu and J. Y. Dai, Memory effects of carbon nanotubes as charge storage nodes for floating gate memory applications, The Hong Kong Polytechnic University, Applied Physics Letters 88, 113104, Mar. 14, 2006.*

(Continued)

*Primary Examiner*—W. David Coleman
*Assistant Examiner*—Maliheh Malek
(74) *Attorney, Agent, or Firm*—Brooks, Cameron & Huebsch, PLLC

(57) ABSTRACT

A memory cell is provided including a tunnel dielectric layer overlying a semiconductor substrate. The memory cell also includes a floating gate having a first portion overlying the tunnel dielectric layer and a second portion in the form of a nanorod extending from the first portion. In addition, a control gate layer is separated from the floating gate by an intergate dielectric layer.

19 Claims, 13 Drawing Sheets

U.S. PATENT DOCUMENTS

| | | | |
|---|---|---|---|
| 2003/0054723 A1* | 3/2003 | Choi et al. | 445/46 |
| 2004/0070021 A1 | 4/2004 | Yuan | |
| 2005/0127351 A1* | 6/2005 | Tolt | 257/10 |
| 2005/0161731 A1* | 7/2005 | Ingersoll et al. | 257/325 |
| 2005/0199939 A1 | 9/2005 | Lutze et al. | |
| 2005/0202615 A1* | 9/2005 | Duan et al. | 438/197 |
| 2005/0212034 A1 | 9/2005 | Sasago et al. | |
| 2006/0003531 A1 | 1/2006 | Chang et al. | |
| 2006/0011972 A1* | 1/2006 | Graham et al. | 257/324 |
| 2006/0033152 A1 | 2/2006 | Kim et al. | |
| 2006/0043458 A1 | 3/2006 | Rudeck | |
| 2006/0046394 A1* | 3/2006 | Ramaswamy et al. | 438/268 |
| 2006/0046395 A1* | 3/2006 | Ramaswamy et al. | 438/269 |
| 2006/0046402 A1 | 3/2006 | Li et al. | |
| 2006/0046422 A1 | 3/2006 | Tran et al. | |
| 2006/0081886 A1 | 4/2006 | Mostarshed et al. | |
| 2006/0081911 A1* | 4/2006 | Batra et al. | 257/315 |
| 2006/0086314 A1 | 4/2006 | Zhang et al. | |
| 2006/0110870 A1* | 5/2006 | Bhattacharyya | 438/197 |
| 2006/0118853 A1* | 6/2006 | Takata et al. | 257/314 |
| 2006/0166435 A1* | 7/2006 | Teo et al. | 438/257 |
| 2006/0273377 A1* | 12/2006 | Chae et al. | 257/321 |
| 2007/0014151 A1* | 1/2007 | Zhang et al. | 365/185.01 |
| 2007/0085459 A1* | 4/2007 | Hudspeth et al. | 313/309 |
| 2007/0148864 A1* | 6/2007 | Hyun | 438/257 |
| 2007/0231985 A1* | 10/2007 | Forbes | 438/197 |
| 2007/0247048 A1* | 10/2007 | Zhang et al. | 313/311 |
| 2008/0035983 A1* | 2/2008 | Sandhu et al. | 257/316 |
| 2008/0061351 A1* | 3/2008 | Jang et al. | 257/315 |
| 2008/0068876 A1* | 3/2008 | Sandhu et al. | 365/149 |
| 2008/0121966 A1* | 5/2008 | Muralidhar et al. | 257/315 |
| 2008/0121967 A1* | 5/2008 | Muralidhar et al. | 257/315 |
| 2008/0157162 A1* | 7/2008 | Doyle et al. | 257/315 |
| 2008/0277719 A1* | 11/2008 | Choi et al. | 257/324 |
| 2009/0057744 A1* | 3/2009 | Weimer et al. | 257/314 |

FOREIGN PATENT DOCUMENTS

| | | |
|---|---|---|
| EP | 1 675 181 A1 | 6/2006 |
| WO | WO 00/51188 A1 | 8/2000 |

OTHER PUBLICATIONS

Islam, M. Saif, et al., "A novel interconnection technique for manufacturing nanowire devices", Appl. Phys. A 80, pp. 1133-1140, (2005).

Noborisaka, Jinichiro, et al., "Catalyst-fee growth of GaAs nanowires by selective-area metalorganic", Appl. Phys. Lett. 86 213102 (2005).

Steckel, J., Growth of Aligned Semiconductor Nanorods Over Large Areas: Towards the Creation of a Novel Solar Cell, pp. 15, (Apr. 16, 2004).

T.I. Kamins, et al. "Ti-catalyzed Si nanowires by chemical vapor deposition: Microscopy and growth mechanisms," J. App. Physics, Jan. 15, 2001, pp. 1008-1016, Vol. 89, No. 2.

International Search Report (5 pgs.).

* cited by examiner

NANOSCALE FLOATING GATE AND METHODS OF FORMATION

BACKGROUND

Memory devices are typically provided as internal storage areas in a computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that generally can be erased and reprogrammed in blocks. Many modern personal computers (PCs) have their BIOS (basic input-output system) stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed by charging the floating gate. The charge can be removed from the floating gate by a block erase operation. The data in a cell is determined by the presence or absence of the charge in the floating gate.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

Memory device fabricators are continuously seeking to increase performance. However, the scaling of memory cells is limited by the need to increase and/or maintain coupling between a control gate and a floating gate while minimizing the interference between adjacent floating gates. One method of increasing performance of a floating gate memory cell is to increase the coupling of the control gate to the floating gate. An additional method of increasing performance involves placing more memory cells in the same or a smaller area on a memory device. Unfortunately, each method can lead to increased parasitic coupling of the gate stacks.

DETAILED DESCRIPTION

Figure 1A:
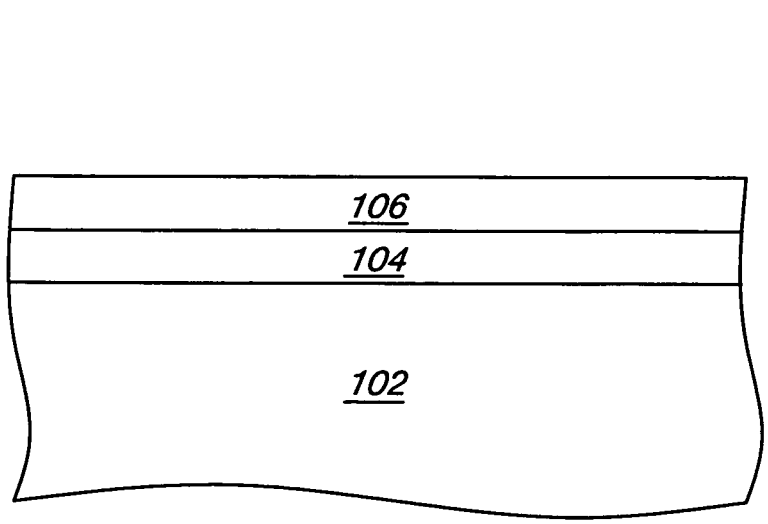
FIGS. 1A-1G illustrate cross-sectional and top plan views of a portion of a memory array during various stages of fabrication in accordance with an embodiment of the present disclosure.

One embodiment of the present disclosure provides a memory cell. The memory cell includes a tunnel dielectric layer overlying a semiconductor substrate, a floating gate having a first portion overlying the tunnel dielectric layer and a second portion in the form of a nanorod extending from the first portion. The memory cell further includes a control gate layer separated from the floating gate by an intergate dielectric layer.

In another embodiment of the present disclosure there is provided a method of fabricating floating gate memory cells. The method includes forming a tunnel dielectric layer overlying a semiconductor substrate, forming a first layer of a floating gate overlying the tunnel dielectric layer, and forming an isolation region in a semiconductor substrate that extends above a surface of the first layer. The method further includes forming spacers on sidewalls of the isolation region, where a portion of the first layer remains exposed between the spacers and forming a nanorod on exposed portions of the first layer as part of the floating gate. The method still further includes forming a control gate separated from the nanorod by an intergate dielectric layer.

As used herein, the term "substrate" or "substrate assembly" used in the following description may include a number of semiconductor-based structures that have an exposed semiconductor surface. "Structure" can be understood to include silicon, silicon-on-insulator (SOI), silicon-on sapphire (SOS), doped, and undoped semiconductors. In addition, structure can be understood to include epitaxial layers of silicon supported by a base semiconductor foundation. The base semiconductor foundation is typically the lowest layer of silicon material on a wafer or a silicon layer deposited on another material.

The semiconductor need not be silicon-based. For example, the semiconductor can be silicon-germanium, germanium, or gallium-arsenide. When reference is made to "substrate" in the following description, previous process steps may have been utilized to form regions or junctions in or on the semiconductor structure and/or foundation. When reference is made to a substrate assembly, various process steps may have been previously used to form or define regions, junctions, various structures or features, and openings such as capacitor plates or barriers for capacitors.

As used herein, "layer" can refer to a layer formed on a substrate using a deposition process. The term "layer" is meant to include layers specific to the semiconductor industry, such as "barrier layer," "dielectric layer," and "conductive layer." The term "layer" is also meant to include layers found in technology outside of semiconductor technology, such as coatings on glass.

Various embodiments of the present disclosure utilize an inverse-T floating gate structure, where a first portion of the floating gate is a layer on the substrate, and a second portion is a nanorod extending from the layer to facilitate reduced spacing between adjacent cells without significantly impacting parasitic capacitance. As used herein, "nanorod" refers to an elongated material that includes at least one cross sectional dimension that ranges from two (2) nanometers (nm) to ten

(10) nm, and has an aspect ratio (length:width) that ranges from 5:1 to 100:1. Also, although nanorods are frequently referred to, the techniques described herein are also applicable to nanowires, nanotubes, and nanoribbons. Also, the nanorods can be formed having different shapes, for example, the nanorods can be circular, rectangular, polygonal, or elliptical. Other shapes for the nanorods are also possible.

Due to the elongate structure of the nanorod, the floating gate formed including a nanorod has more length than width, resulting in sufficient surface area to maintain adequate coupling between the floating gate and the control gate. The inclusion of the nanorod structure also results in increased distance between adjacent and/or neighboring floating gates, thus facilitating a reduction in parasitic capacitance leading to improved gate coupling characteristics. Due to the use of nanorods, the floating gates may be formed with reduced spacing, thus facilitating increased array density.

In the Figures, the first digit of a reference number refers to the Figure in which it is used, while the remaining two digits of the reference number refer to the same or equivalent parts of embodiment(s) of the present disclosure used throughout the several figures. The scaling of the figures does not represent precise dimensions and/or dimensional ratios of the various elements illustrated herein.

FIGS. 1A-1G depict both the structure and a method of forming a portion of a memory array, or memory cell 100, in accordance with one embodiment of the present disclosure. Although a single memory cell 100 is illustrated and described herein, it will be understood that the memory cell 100 is formed as part of an array of memory cells 100.

FIG. 1A depicts a memory cell 100 after several processing steps have occurred. Formation of the type of structure depicted in FIG. 1A will be appreciated by one of ordinary skill in the art and will not be detailed herein. In general, FIG. 1A illustrates a substrate 102 upon which a tunnel dielectric layer 104 and a first layer 106 of a floating gate have been formed. As discussed herein, a substrate 102 can be formed of silicon, silicon-germanium, germanium, or gallium-arsenide. Other substrate 102 materials are also possible.

In some embodiments, the tunnel dielectric layer 104 is a silicon oxide, however, it may include other dielectric materials. For example, the tunnel dielectric layer can include silicon oxides ($SiO/SiO_2$), silicon nitrides ($SiN/Si_2N/Si_3N_4$), and silicon oxynitrides ($SiO_xN_y$).

In one embodiment, the tunnel dielectric layer 104 can be formed by thermal oxidation of the substrate 102. In an alternate embodiment, the tunnel dielectric layer 104 can be formed by a blanket deposition of a dielectric material, such as by chemical vapor deposition (CVD) or physical vapor deposition (PVD). In addition, in one embodiment, the tunnel dielectric layer 104 can be formed such that it has a thickness of approximately fifty (50) nm or less.

In some embodiments, the first layer 106 is also referred to as a first portion of the floating gate, as discussed herein. In some embodiments, the first layer 106 can be a polysilicon layer. The first layer 106 can also be formed from other materials. For example, the first layer 106 can be formed of silicon germanium (SiGe), silicon-on sapphire, germanium, or gallium-arsenide.

In one embodiment, the first layer 106 can be formed by CVD. In another embodiment, the first layer 106 can be formed by PVD. Other methods of forming the first layer 106 are also possible. In one embodiment, the first layer 106 can have a thickness of approximately twenty (20) nm or less. In addition, as discussed herein, in some embodiments, the first layer 106 can be used to form a first portion of a floating-gate for floating gate memory cells.

Figure 1B:
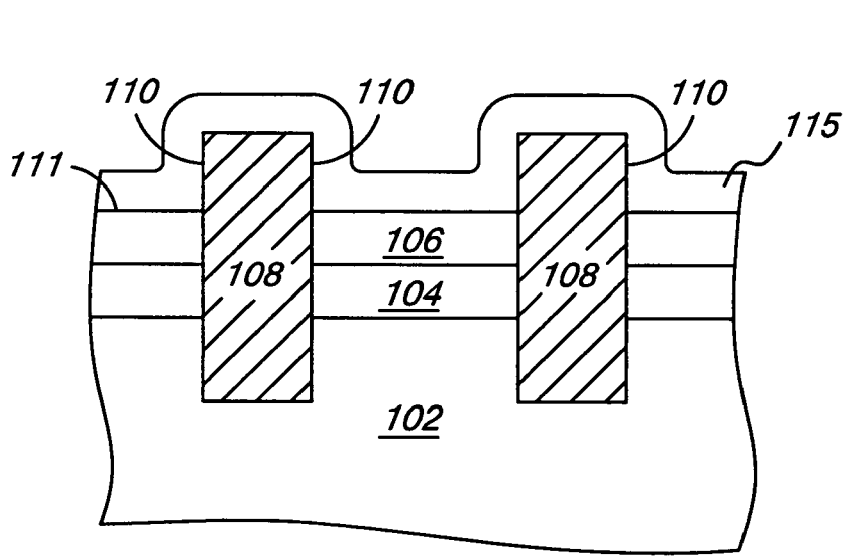

Referring to FIG. 1B, in one embodiment, isolation regions 108 can be formed to reduce parasitic capacitance and/or cross talk between adjacent floating gates. In some embodiments, isolation regions 108 can be formed by photolithographic etching to form, for example, shallow trenches. Shallow trench isolation (STI) can be used to form the isolation regions 108, the methods of which are known in the art and will not be further described herein. In one embodiment, the isolation regions 108 are etched to a depth of at least fifteen (15) nm relative the upper most surface of the first layer 106. In some embodiments, following STI, an STI fill is performed, as is shown in FIG. 1B. In some embodiments, the STI fill material can be an oxide laid down by high density plasma deposition. The use of other fill materials is also possible. The planarized structure after a chemical mechanical polish (CMP) step is shown in FIG. 1B.

In some embodiments, the isolation regions 108 can have sidewalls 110 that extend above the surface 111 of the first layer 106. In one embodiment, the sidewalls 110 can extend above the surface 111 of the first layer 106 by at least approximately twenty (20) nm. In this embodiment, the isolation regions 108 can have a total height 112 equal to at least approximately thirty-five (35) nm.

From the structure of FIG. 1B, different options to form the memory cell 100 of the present disclosure are available. In one embodiment, a spacing layer 115 can be deposited on the first layer 106 and isolation regions 108. The spacing layer 115 can be formed of several different materials, for example, the spacing layer 115 can be formed of materials selected from the group including, but not limited to, polysilicon, silicon nitride, silicon oxynitride, and silicon dioxide. Other materials for the spacing layer 115 are also possible. In addition, the spacing layer 115 can be formed by a variety of methods such as CVD or PVD. Other methods of forming the spacing layer 115 are also possible.

Figure 1C:
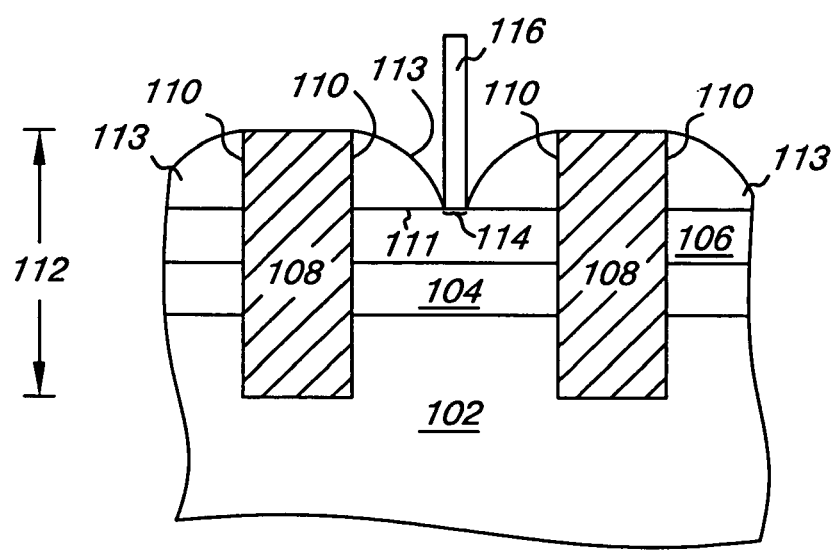

To form the structure shown in FIG. 1C, the spacing layer 115 is removed. In one embodiment the spacing layer 115 is removed by etching. For example, in one embodiment, an anisotropic etch can be performed to form spacers 113 on the sidewalls 110 of the isolation regions 108. In one embodiment, the spacing layer can be etched such that the spacers 113 are separated by an exposed portion 114 of the first layer 106. In such embodiments, the spacers 113 can have a width in a range of two (2) nm to seven (7) nm. In some embodiments, the portion 114 of the first layer 106 exposed also can have a width in a range of two (2) nm to ten (10) nm.

In one embodiment, nanorods 116 can be grown on the portion 114 of the first layer 106 left exposed, forming the second portion of the floating gate. The nanorods 116 can be formed from materials such as silicon (Si), germanium (Ge), gallium phosphate (GaP), gallium arsenide (GaAs), indium phosphate (InP), gold (Au), silver (Ag), zinc (Zn), zinc oxide (ZnO), silicon-germanium (SiGe), silicon-germanium-carbon (SiGeC), zinc sulfide (ZnS), gallium nitride (GaN), indium gallium arsenide (InGaAs), and indium oxide ($In_2O_3$). Other nanorod 116 materials are also possible.

In some embodiments, the nanorods 116 are grown so that the nanorods 116 are approximately perpendicular to the plane of the substrate 102. In some embodiments, the nanorods 116 are grown so that the nanorods 116 extend from the first layer 106 at approximately a ninety (90) degree angle relative the tunnel dielectric layer 104. In some embodiments, the nanorods 116 can be formed using a vapor-liquid-solid (VLS) mechanism. In such embodiments, the nanorod 116 growth can be metal nanoparticle directed axial growth, where the metal nanoparticle acts as a catalyst that directs the growth in a highly one-dimensional manner. As used herein, "nanoparticle" refers to a material having an aspect ratio (length:width) of approximately 1:1, that includes at least one cross sectional dimension in the range of one (1) nm to ten (10) nm. In one embodiment, the metal nanoparticles can be injected into the first layer 106. In other embodiments, the metal nanoparticles can be deposited on the first layer 106.

In general, and not wishing to be bound by theory, the metal nanoparticle catalyst forms a liquid alloy with the nanorod 116 material of interest by serving as a preferential site for absorption of reactant because there is a much higher sticking probability on liquid versus solid surfaces. The liquid alloy droplet supersaturates with nanorod 116 precursor and becomes the nucleation site for crystallization. As long as the catalyst remains liquid, one dimensional growth can occur in the presence of reactant based on the preference of the incoming reactant to diffuse to and condense at the existing solid/liquid interface. This occurs because less energy will be required to continue crystal step growth compared with secondary nucleation events in a finite volume.

In one embodiment, a mixture of hydrogen and silicon tetrachloride ($SiCl_4$) can be introduced into a vacuum chamber containing a silicon substrate with a small gold (Au) particle sitting on top at a temperature of nine hundred fifty (950) degrees Celsius (° C.). In this embodiment, when nucleation occurs, the alloy droplet can become displaced from the substrate 102 and "rides" on top of the growing nanorod 116. In other embodiments, germanium nanorods 116 can be grown using a Au catalyst. In addition, carbon nanorods 116 can be formed using a nickel (Ni) catalyst.

In one embodiment, nanorods 116 of silicon can be grown on the portion 114 of the first layer 106 left exposed. In such embodiments, titanium nanoparticles can be deposited on the portion 114 of the first layer 106 left exposed and subsequently annealed. In addition, in such embodiments the titanium nanoparticles can be exposed to silane ($SiH_4$) and/or dichlorosilane ($SiH_2Cl_2$) gas at a temperature in a range from six hundred (600)° C. to eight hundred (800)° C. By exposing the titanium and the first layer 106 to the SiH and/or $SiH_2Cl_2$ gas, silicon diffuses through and/or around the titanium nanoparticles and precipitates out. In such embodiments, as the silicon precipitates, nanorods 116 of silicon grow under the titanium nanoparticles, causing the nanorods 116 to have titanium tips in the form of $TiSi_x$. The titanium tips can be removed by etching in subsequent process steps.

In some embodiments, nanorods 116 of gallium arsenide (GaAs) can be grown on the portion 114 of the first layer 106 left exposed. In this embodiment, the nanorod 116 growth can be carried out in a metalorganic vapor-phase epitaxy (MOVPE) system. Further, trimethylgallium (TMG) and twenty (20) percent arsine ($AsH_3$) diluted in hydrogen ($H_2$) can be used as source materials, while the nanorod 116 growth can be carried out at a temperature of seven hundred fifty (750)° C.

FIG. 1C shows a cross-sectional view of a portion of the memory array 100 with a nanorod 116. In some embodiments, the nanorods 116 can be grown to a height ranging from fifty (50) nm to two hundred (200) nm and a width equal to approximately five (5) nm.

Figure 1D:
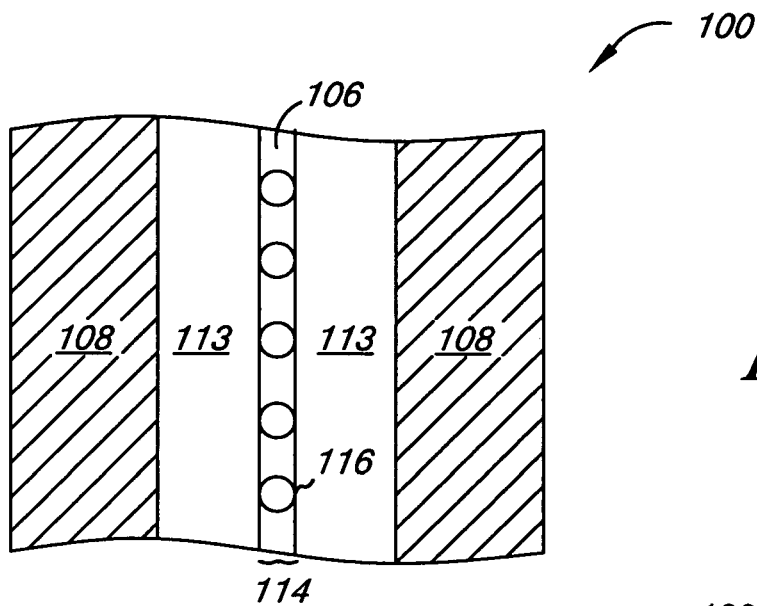

FIG. 1D shows a top plan view of a portion of the memory cell 100. As illustrated, the spacers 113 are formed such that only a portion 114 of the first layer 106 is left exposed. In this embodiment, the nanorods 116 are forced to grow on the portion 114 of the first layer 106 left exposed by the spacers 113. As discussed herein, the nanorods 116 grow from a surface reaction between the material of the first layer 106 and the reactant gases. By covering part of the first layer 106 with spacer 113, a surface reaction between the material of the first layer 106 and the reactant gas is prevented where the spacer 113 covers the first layer 106, thus preventing the growth of a nanorod 116 on the first layer 106 where the spacer 113 is located. Therefore, in some embodiments, the spacers 113 can be formed to control the width of the nanorods 116. In addition, in some embodiments, spacers 113 can be formed to control the location of the nanorod 116 growth. However, to obtain nanorods 116 in uniformly spaced intervals, further processing can be required, as discussed herein.

Figure 1E:
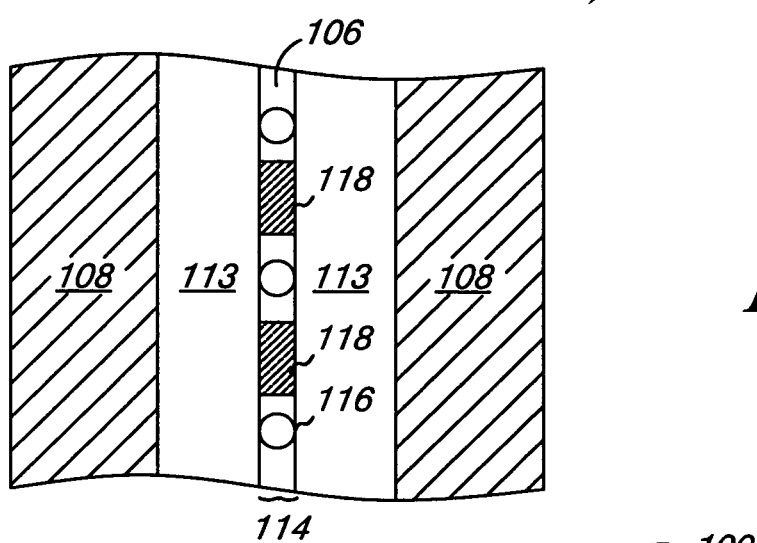

FIG. 1E shows a top plan view of a portion of the memory cell 100 where a patterned mask layer 118 is formed overlying a first portion of the nanorods 116. Subsequently, the remaining portion of the nanorods 116 left exposed can be removed, leaving the first portion of the nanorods 116 covered by the patterned mask layer 118. To form the patterned mask layer 118, a photolithographic resist material can be deposited overlying the nanorods 116 and exposed to a radiation source, such as UV light. The photolithographic resist material can then be developed to define areas overlying the first portion of the nanorods 116, where the remaining portion of the nanorods 116 are left exposed for removal. In some embodiments, the remaining portion of the nanorods 116 not covered by the patterned mask layer 118 can be removed by performing an etch that is selective to the nanorod 116 material. In other words, the etch to remove the remaining portion of the nanorods 116 not covered by the patterned mask layer 118 can be performed such that the process will etch the exposed nanorods 116 more aggressively than the nanorods 116 covered by the patterned mask layer 118.

FIG. 1E shows each section of the patterned mask layer 118 covering a single nanorod 116, in some embodiments, however, the patterned mask layer 118 is formed over more than one nanorod 116. In some embodiments, a section of the patterned mask layer 118 is formed over several nanorods 116 and/or a portion of a nanorod 116. In an additional embodiment, the sections of patterned mask layer 118 can have differing amounts of nanorods 116. In these embodiments, once the patterned mask layer 118 is removed, as discussed herein, the memory cell 100 can include a portion of a nanorod 116 that has the original height, but a portion of the nanorod 116 width may have been removed.

Figure 1F:
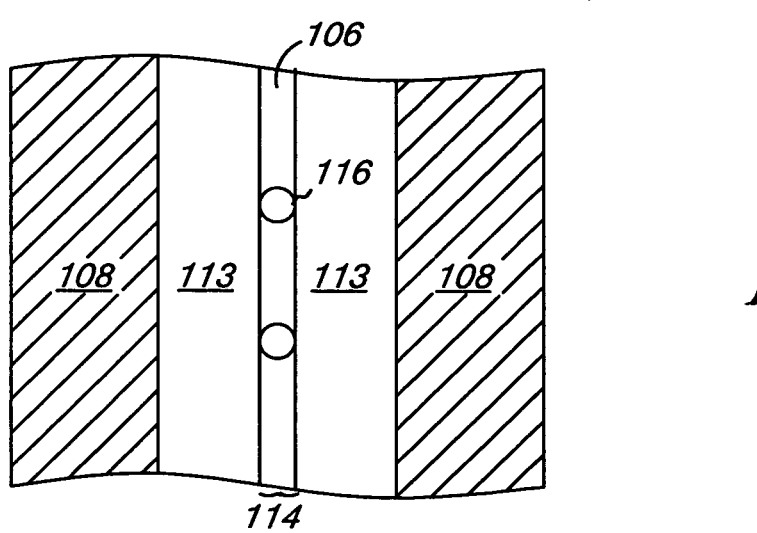

FIG. 1F shows a top plan view of a portion of the memory cell 100 after the exposed portion of the nanorods 116 and the patterned mask layer have been removed. In one embodiment, an etch of the patterned mask layer can be selective to the material of the patterned mask material. In this example, the etch of the patterned mask layer can be timed to remove the patterned mask layer without removing the nanorod 116 and/or a portion of the nanorod 116. In some embodiments, the spacers 113 can be removed by performing an etch that is selective to the material of the spacer 113. In various embodiments, the etch to remove the spacers 113 can be performed such that the spacers 113 are etched more aggressively than the nanorods 116.

Figure 1G:
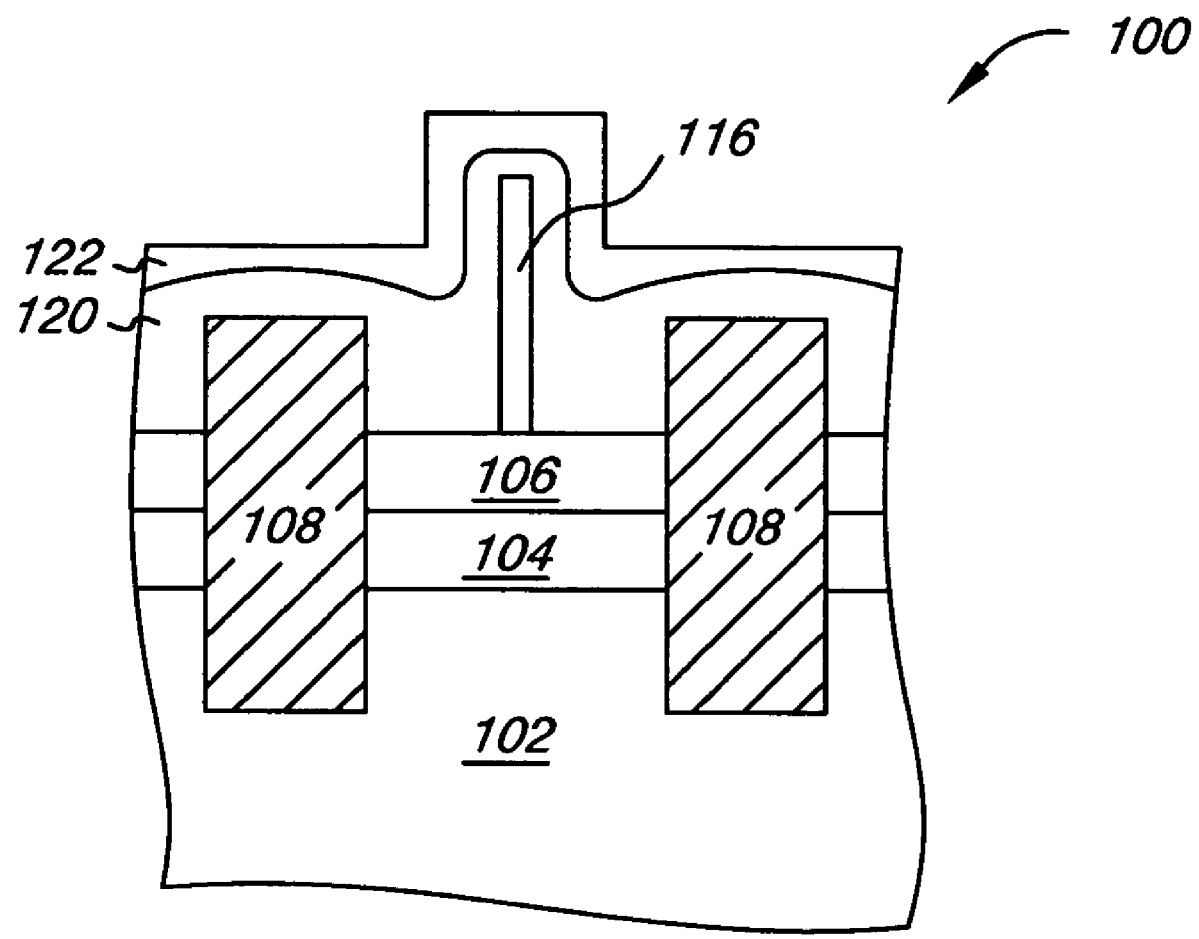

FIG. 1G shows a cross-sectional view of a portion of a memory cell 100 including an intergate dielectric layer 120 and a control gate layer 122. The intergate dielectric layer 120 can be formed overlying the nanorod 116 floating gate. The intergate dielectric layer 120 can be one or more layers of dielectric material. For example, the intergate dielectric layer 120 can be of a multi-layer dielectric material commonly referred to as ONO (oxide-nitride-oxide). Other dielectric materials may be substituted for ONO, such as tantalum oxide, barium strontium titanate, silicon nitride, and other materials providing dielectric properties.

The control gate layer 122 is formed overlying the intergate dielectric layer 120 and patterned to define word lines of a memory device. The control gate layer 122 can be one or more layers of conductive material. In one embodiment, the control gate layer 122 can contain a conductively-doped polysilicon. For a further embodiment, the control gate layer 122 can include a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V), and zirconium (Zr) are recognized as refractory metals. For another embodiment, the control gate layer 122 can contain multiple metal-containing layers, e.g., a titanium nitride (TiN) barrier layer overlying the intergate dielectric layer 120, a titanium adhesion layer overlying the barrier layer and a tungsten layer overlying the adhesion layer. An insulating cap layer (not shown) is often formed overlying the control gate layer 122 to protect and isolate the control gate from further processing.

FIGS. 1A-1G can depict either a NOR-type memory device or a NAND-type memory device, with the differences occurring in the column direction in manners that are well understood in the art of memory fabrication.

As discussed herein, from the structure illustrated in FIG. 1B, different options for forming the memory cell 100 are possible. As discussed herein, once the spacer 113 is formed on the sidewalls 110 of the isolation regions 108, the nanorods 116 can be grown on the exposed portion of the first layer 106. Since the spacers 113 are used to control only the width of the nanorods 116 as they grow, further processing steps in the form of a masking layer and etching are required to obtain nanorods 116 at the desired intervals to allow for individual memory cells to be formed, as discussed herein.

In some embodiments, however, a masking layer and/or spacing layer can be patterned on the first layer 106 to provide an area with a specific dimension for the growth of the nanorods 116, eliminating the step of masking and etching existing nanorods 116, as described herein with respect to FIGS. 1D-1F.

As shown in FIG. 1B, in one embodiment, a spacing layer 113 can be patterned on the first layer 106 using photolithography. However, due to factors such as optics and light or radiation wavelength, photolithography techniques each have a minimum pitch below which a particular photolithographic technique cannot reliably form features. Thus, the minimum pitch of a photolithographic technique can limit how small the area for the growth of the nanorods 116 can be. Pitch is defined as the distance between an identical point in two neighboring features. These features are typically defined by openings in, and spaced from each other by, a material, such as an insulator or conductor. As a result, pitch can be viewed as the sum of the width of a feature and of the width of the space separating that feature from a neighboring feature.

Figure 2A:
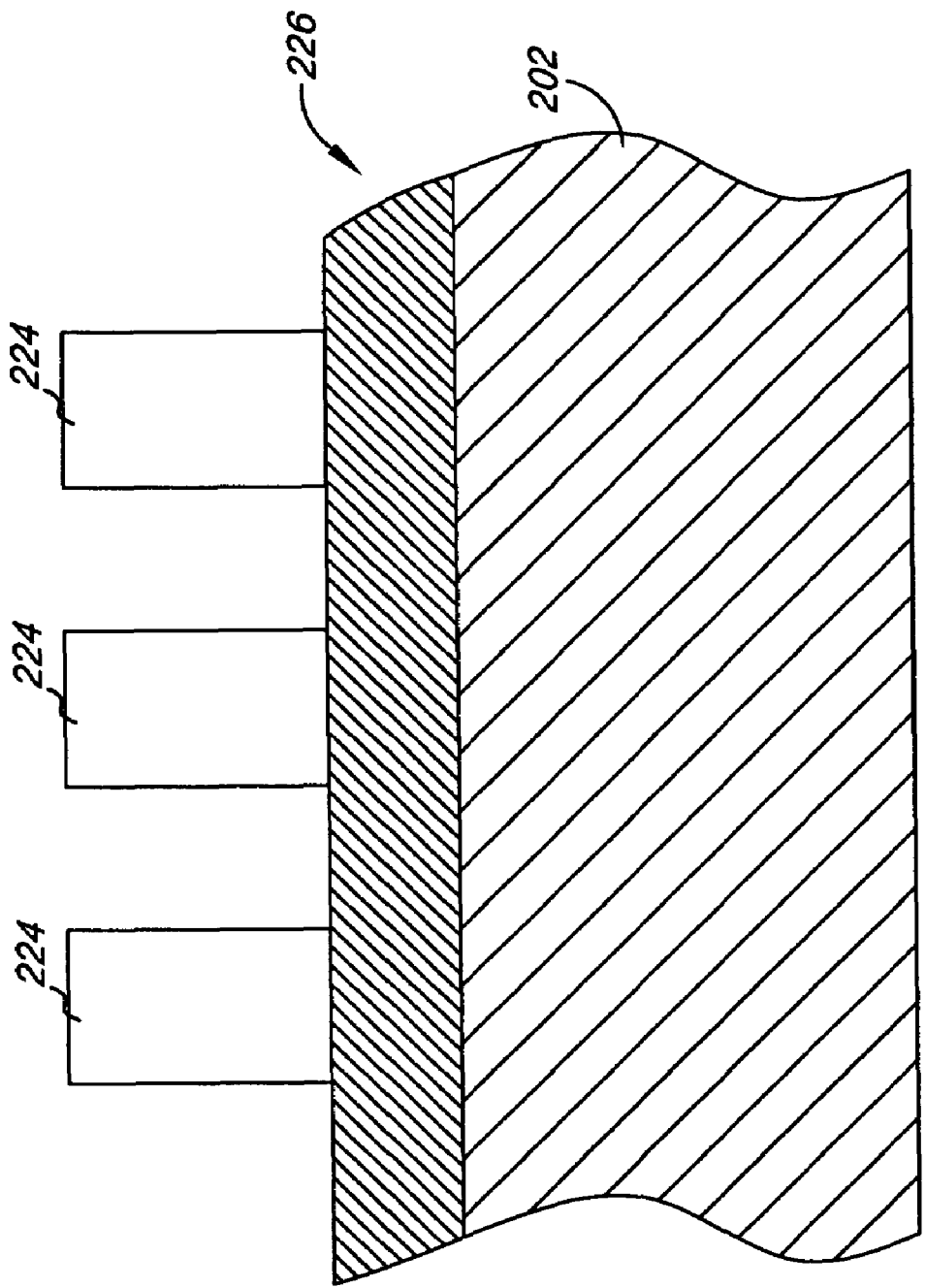
FIGS. 2A-2F illustrate cross-sectional views of mask lines, formed in accordance with a pitch multiplication method for use in forming memory arrays of the present disclosure.
Figure 2B:
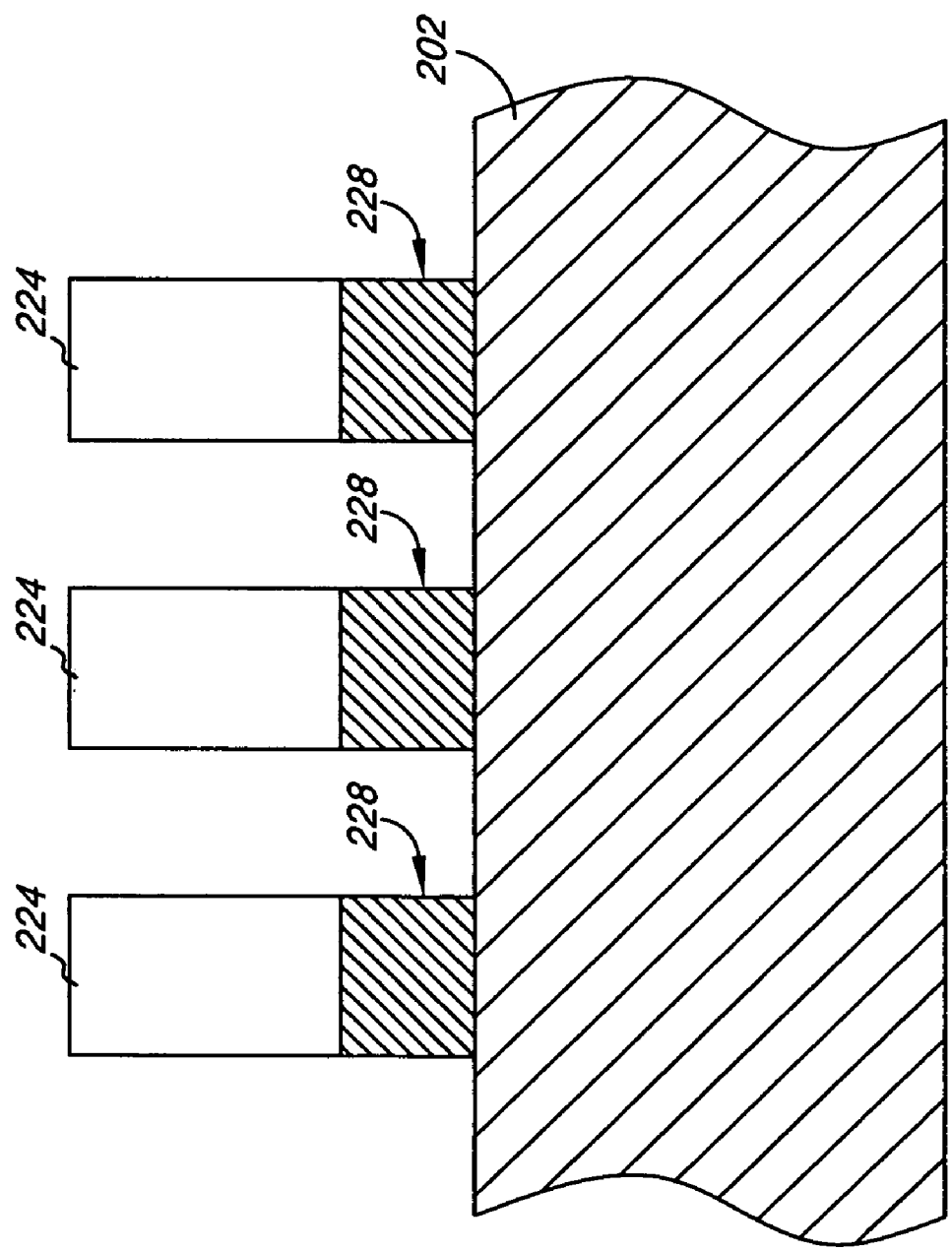
Figure 2C:
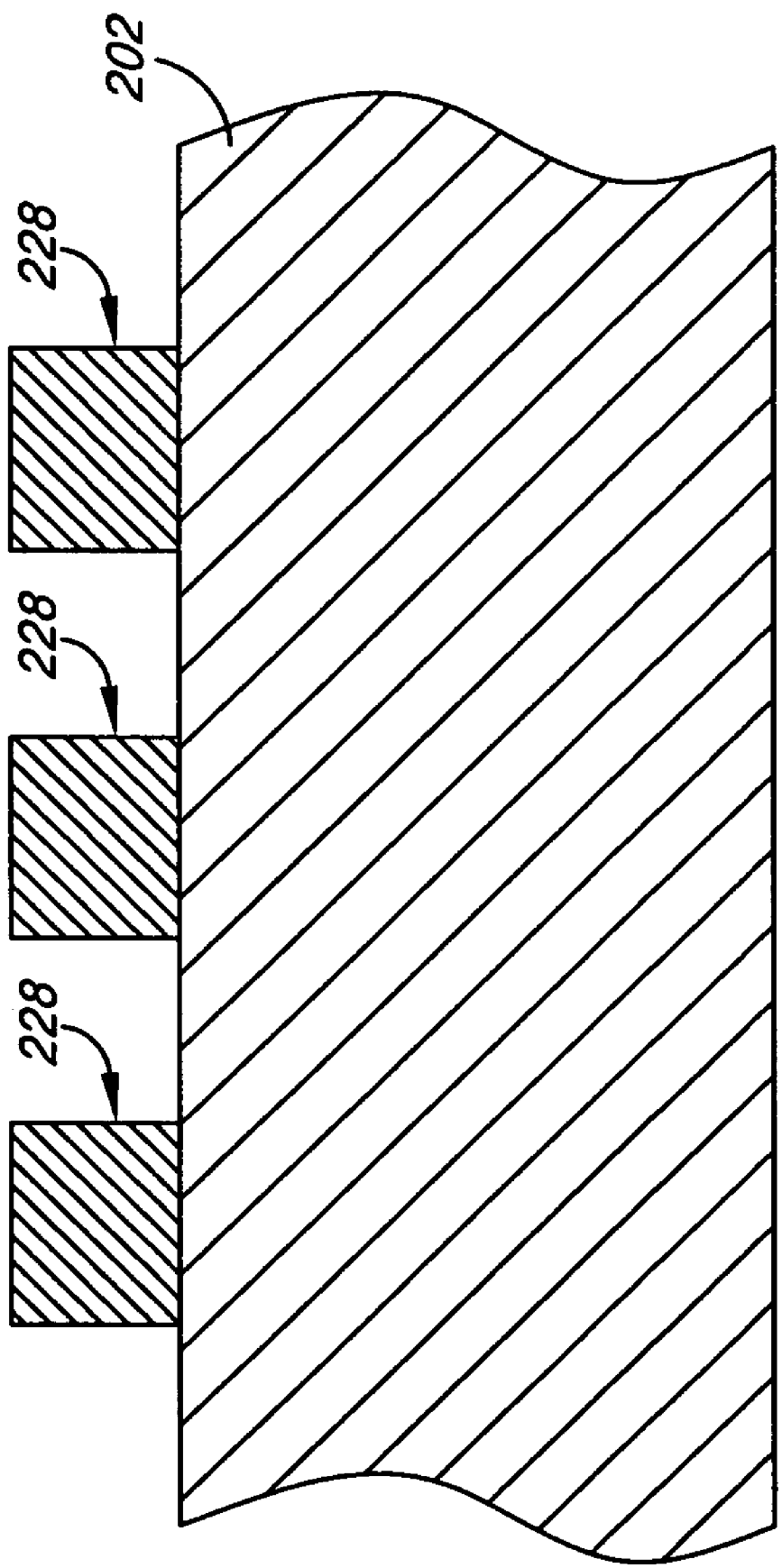
Figure 2D:
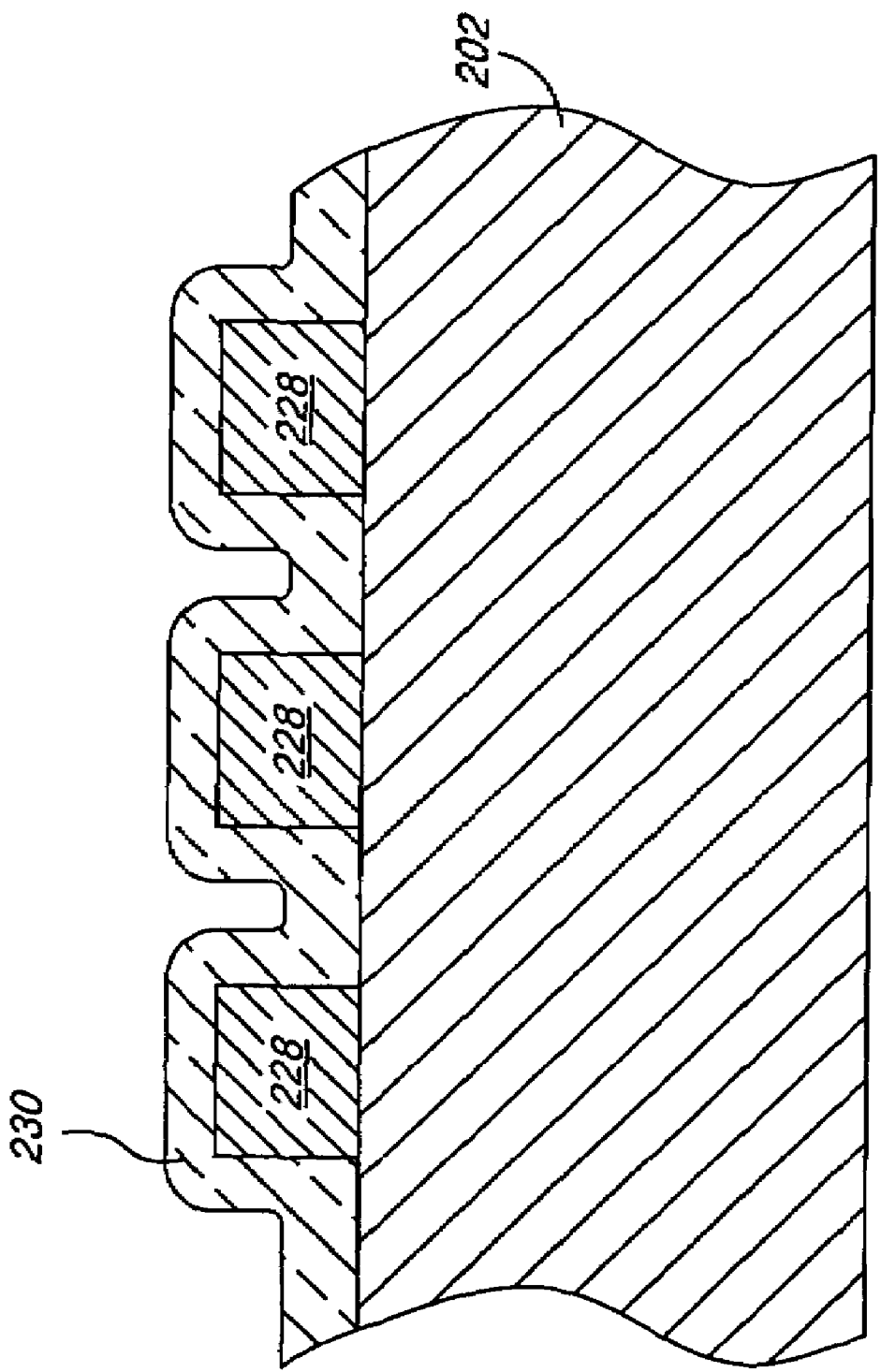
Figure 2E:
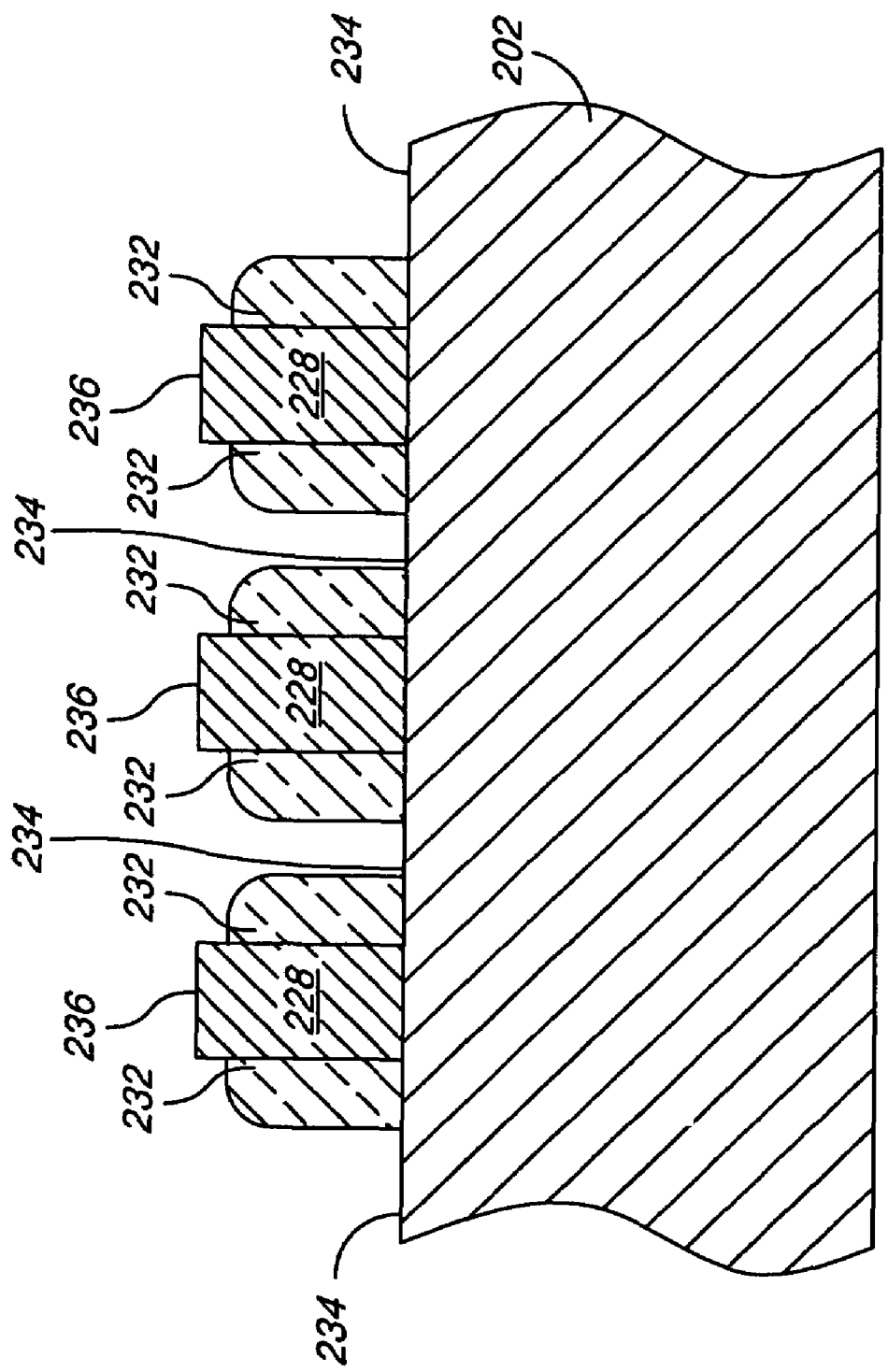
Figure 2F:
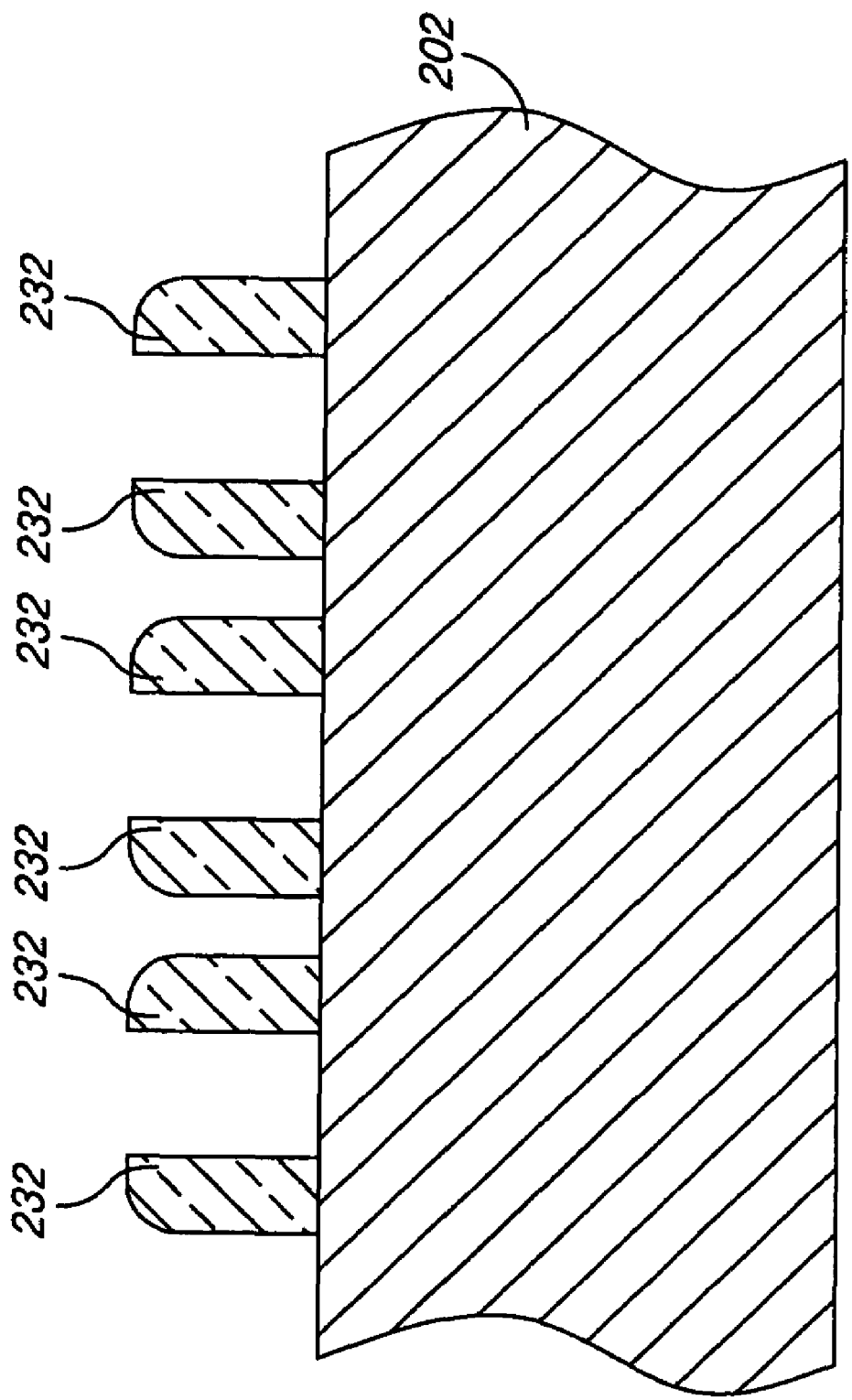

"Pitch doubling" is one method proposed for extending the capabilities of photolithographic techniques beyond their minimum pitch. Such a method is illustrated in FIGS. 2A-2F and described in U.S. Pat. No. 5,328,810, issued to Lowrey et al., the entire disclosure of which is incorporated herein by reference. With reference to FIG. 2A, photolithography is first used to form a pattern of lines 224 in a photoresist layer overlying a layer 226 of an expendable material and a substrate 202. As shown in FIG. 2B, the pattern is then transferred by an etch step (e.g., anisotropic) to the layer 226, forming placeholders or mandrels 228. The lines 224 of photoresist can be stripped and the mandrels 228 can be isotropically etched to increase the distance between neighboring mandrels 228, as shown in FIG. 2C. A layer 230 of spacer material is subsequently deposited over the mandrels 228, as shown in FIG. 2D. Spacers 232 are then formed on the sides of the mandrels by etching the spacer material from the horizontal surfaces 234 and 236 in a directional spacer etch, as shown in FIG. 2E. The remaining mandrels 228 are then removed, leaving behind only the spacers 232, which together act as a mask for patterning, as shown in FIG. 1F. Thus, where a given pitch formerly included a pattern defining one feature and one space, the same width now includes two features and two spaces defined by the spacers 232. As a result, the smallest feature size possible with a photolithographic technique is effectively decreased.

It will be appreciated that while the pitch is actually halved in the example above, this reduction in pitch is conventionally referred to as pitch "doubling," or, more generally, pitch "multiplication." That is, conventionally "multiplication" of pitch by a certain factor actually involves reducing the pitch by that factor. The conventional terminology is retained herein. Note that by forming spacers upon spacers, the definable feature size can be further decreased. Thus, pitch multiplication refers to the process generally, regardless of the number of times the spacer formation process is employed.

Figure 3:
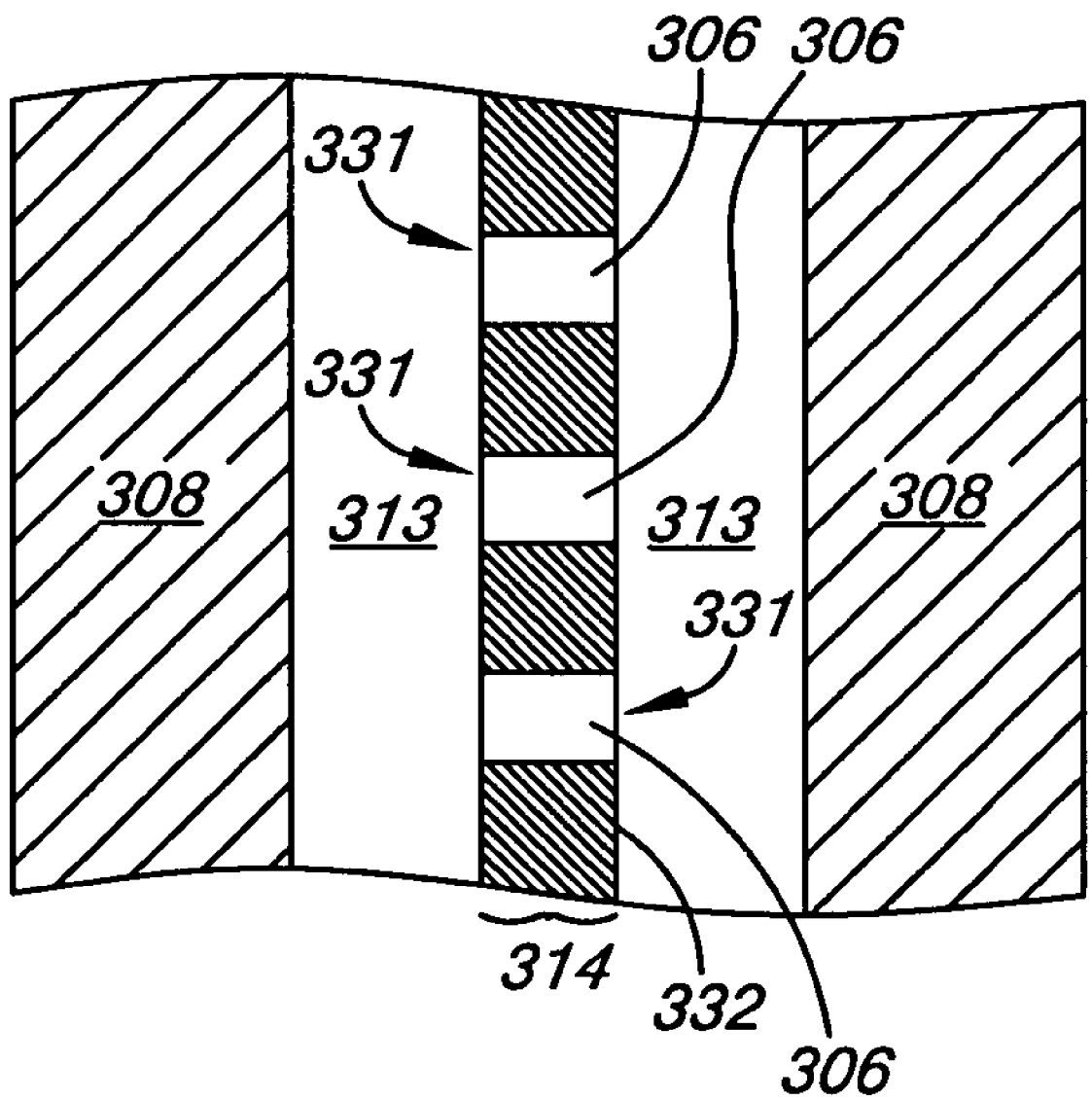
FIG. 3 illustrates a top plan view of a portion of a memory array during a stage of fabrication in accordance with an embodiment of the present disclosure.

FIG. 3 shows a top plan view of an embodiment of the present disclosure where spacers 332 (e.g., second formed spacers) form/define an area 331 of exposed first layer 306. In this embodiment, pitch multiplication can be used to form spacers 332 on the originally exposed portion 314 of the first layer 306 which was defined by spacers 313 (e.g., first formed spacers). By using pitch multiplication, the spacers 332 can be formed such that the area 331 of exposed first layer 306 has a specific dimension, thus allowing the growth of nanorods of a specific dimension. In one embodiment, the area 331 of exposed first layer 306 is five (5) nm by five (nm). In some embodiments, spacers 313 have a width of fifteen (15) nm.

In some embodiments, once the nanorods are formed, the spacing layer 332 can be removed. Further, once the spacers 332 are removed, the dielectric intergate layer and control gate layer can be formed over the nanorod floating gate, as discussed herein to form a portion of a memory array as shown in FIG. 1G.

Figure 4A:
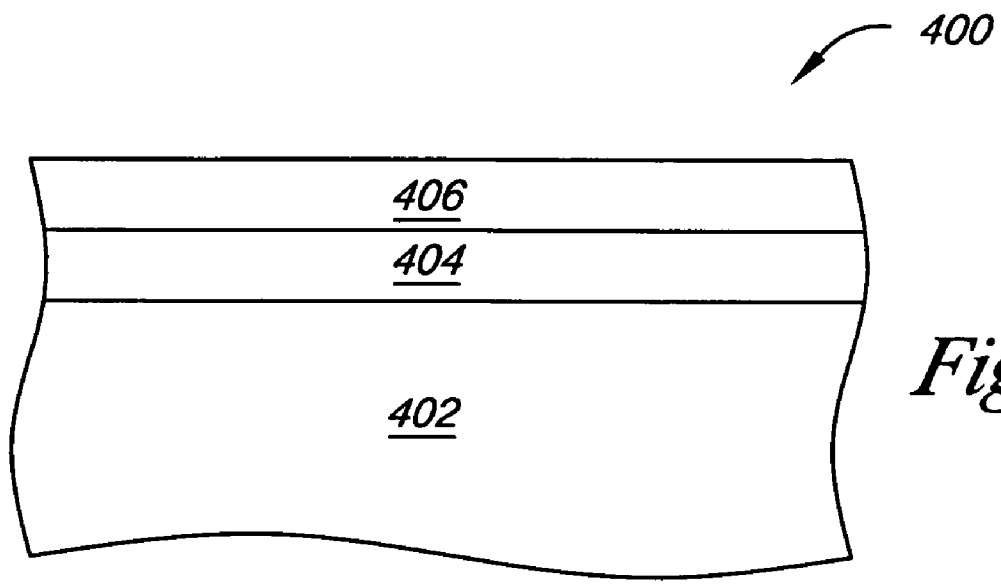
FIGS. 4A-4D illustrate cross-sectional and top plan views of a portion of a memory array during various stages of fabrication in accordance with an embodiment of the present disclosure.

FIGS. 4A-4D depict both the structure and a method of forming a portion of a memory array, or memory cell 400, in accordance with an embodiment of the present disclosure. FIG. 4A depicts a memory cell 400 after several processing steps have occurred. In general, FIG. 4A depicts several stacks of layers that will form word lines of the memory array. The stacks include a tunnel dielectric layer 404 and a first layer, or first portion, 406 of a floating gate, as discussed herein.

Figure 4B:
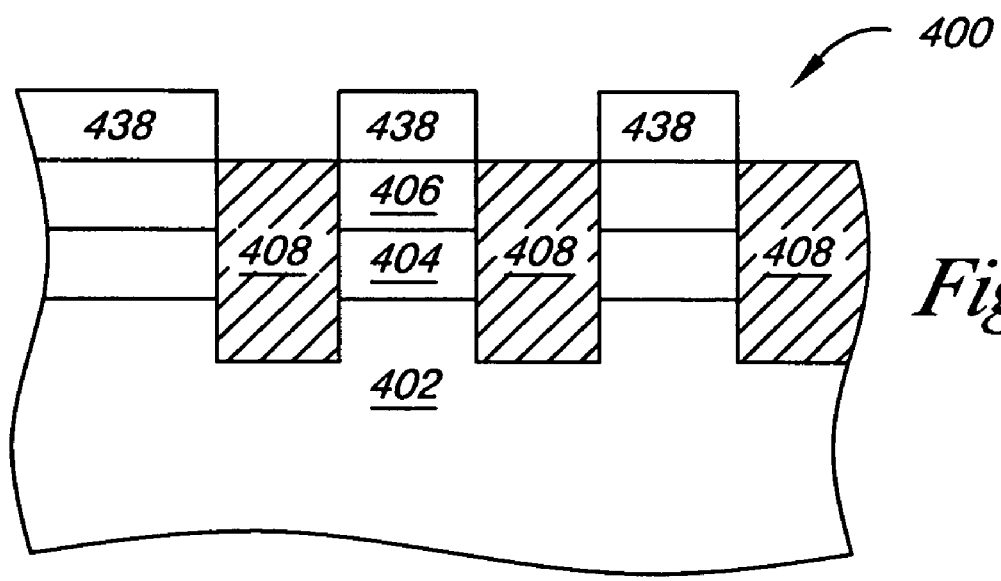
Figure 4C:
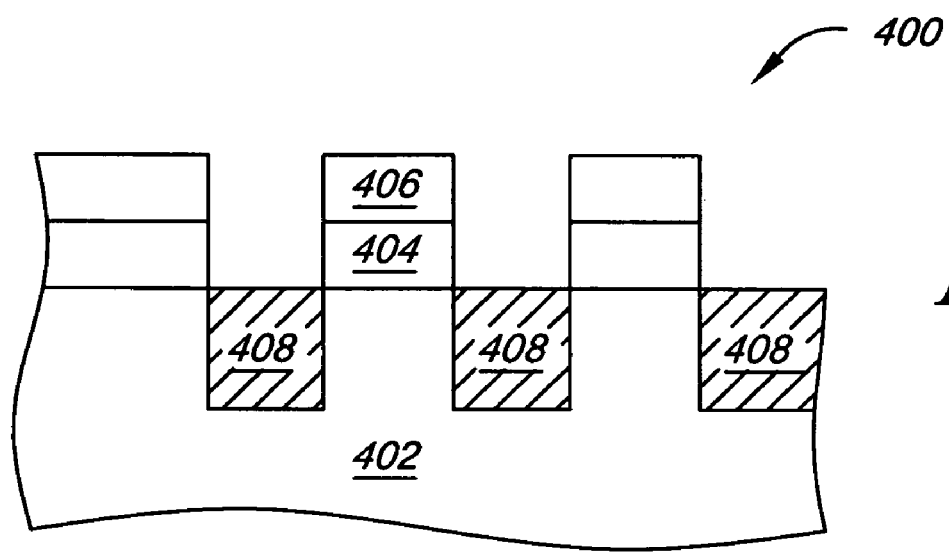

FIG. 4B shows a next sequence of processing steps in accordance with an embodiment of a memory cell according to the present disclosure. In one embodiment, the method includes a dry etch to form openings in the first layer 406 and the tunnel dielectric layer 404. In one embodiment, the dry etch is continued to form isolation regions 408 into the substrate 402. In one embodiment, the isolation regions 408 can be shallow trench isolation regions.

Following etching of the isolation regions 408, the isolation regions 408 can be filled. The isolation regions 408 can be filled with insulating layers, including silicon dioxide, phosphorous doped silicon dioxide, or a dielectric such as silicate glass, silicon oxide, silane, tetraethyl orthosilicate (TEOS) polytetraflouroethylene (PTFE), or silicon nitride. In FIG. 4B, a mask layer 438 is formed and patterned overlying the first layer 406. Subsequently, portions of the isolation regions 408 can be removed, leaving the first layer 406 extending above the isolation regions 408. In one embodiment, the first layer extends above the isolation regions 408 by approximately twenty (20) nm. As one example, a photolithographic resist material could be deposited overlying the first layer 406, exposed to a radiation source, and developed to define areas overlying the isolations regions 408 for removal of the portion of the isolation region 408 fill material. The masking layer 438 can then be removed to obtain the portion of a memory array 400 illustrated in FIG. 4C. In one embodiment, the isolation region fill material is etched so that the tunnel dielectric layer 404 and first layer 406 extend above the isolation region 408 fill material. In one embodiment, the first layer 406 extends above the isolation regions 408 by approximately fifteen (15) nm to twenty (20) nm.

In one embodiment, a patterning layer can be formed on the first layer 406, and is patterned, developed, and etched such that areas of the first layer 406 upon which nanorods are to be grown are exposed. The methods used to pattern the patterning layer can include pitch multiplication to form areas of the first layer 406 with a specific dimension for the growth of nanorods and/or forming and removing nanorods using a masking layer, as discussed herein.

Figure 4D:
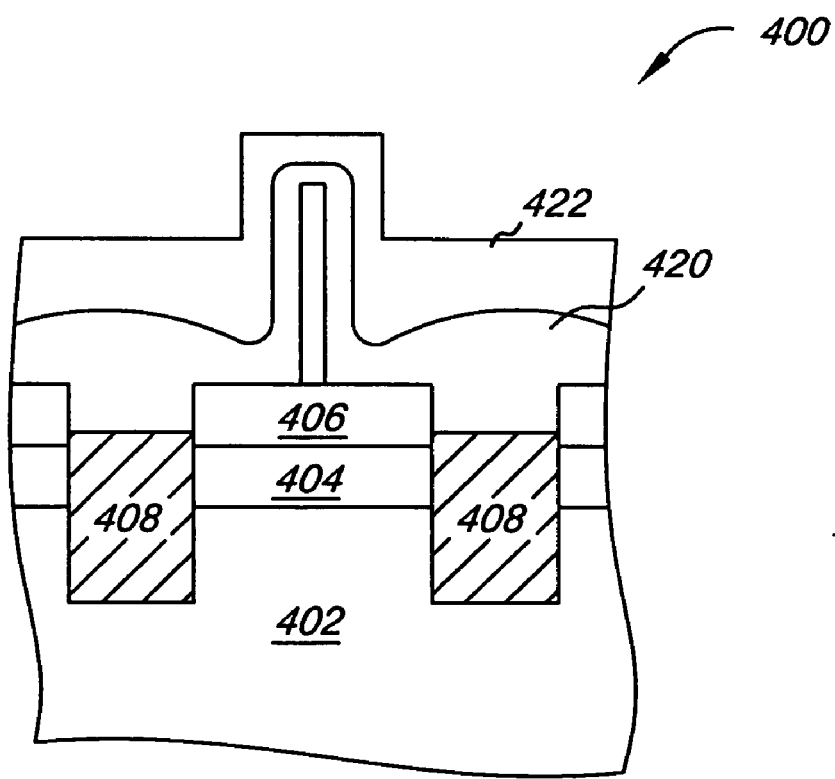

In one embodiment, once the nanorod 416 is grown on the first layer 406, an intergate dielectric layer 420 and control gate layer 422, as discussed herein, can be deposited to form the memory cell 400 shown in FIG. 4D.

Figure 5:
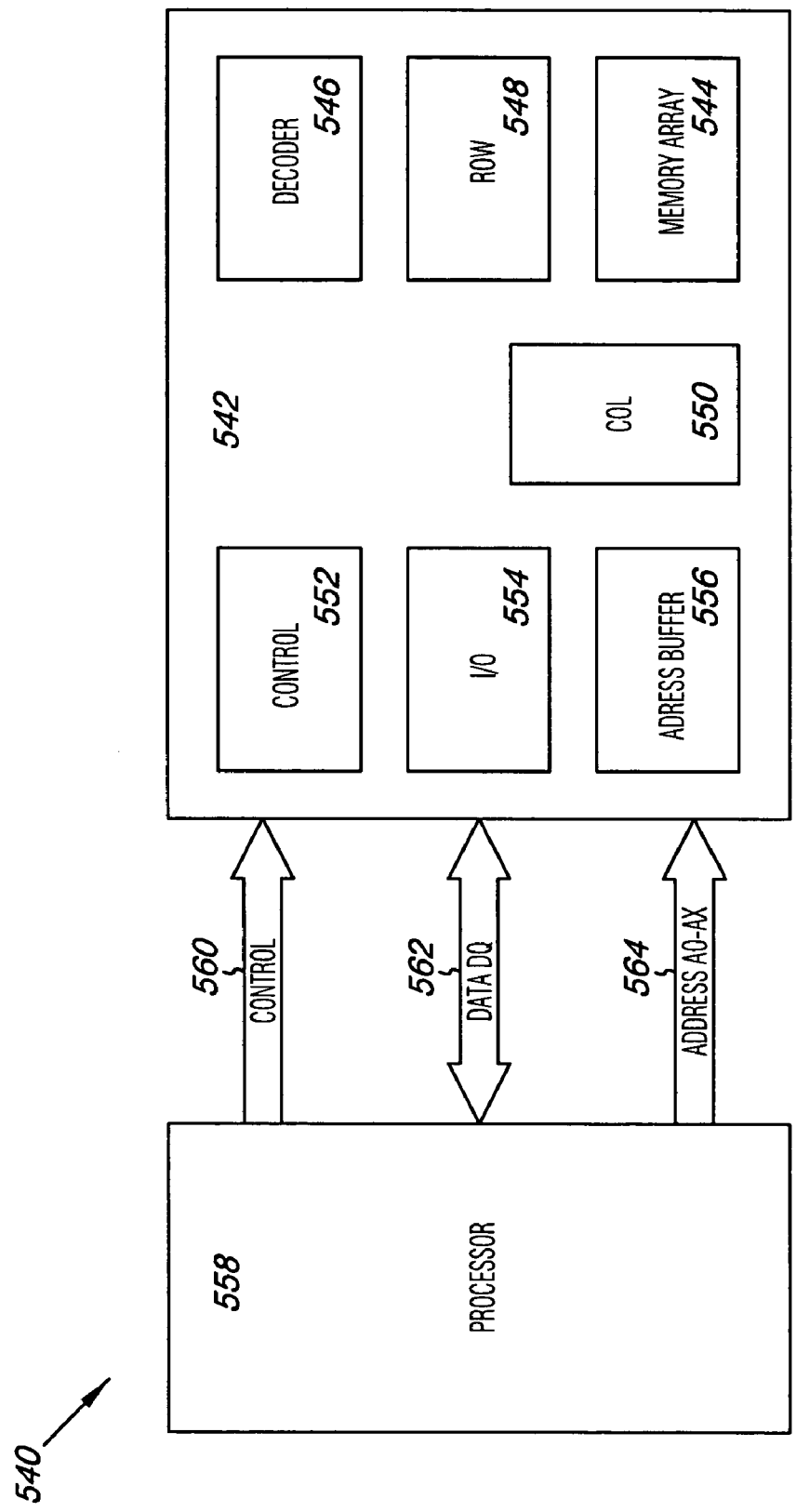
FIG. 5 illustrates a functional block diagram of an electronic system having at least one memory device in accordance with an embodiment of the present disclosure.

FIG. 5 is a block diagram of an electronic system 540, according to an embodiment of the present disclosure. Electronic system 540 includes a non-volatile memory device 542 that includes an array of non-volatile memory cells 544, an address decoder 546, row access circuitry 548, column access circuitry 550, control circuitry 552, Input/Output (I/O) circuitry 554, and an address buffer 556.

The array 544 of non-volatile memory cells includes a non-volatile memory cell structure according to an embodiment of the disclosure. The memory cells (not shown in FIG. 5) of the array 544 of non-volatile memory cells may be floating-gate memory cells, NROM cells or other type of one-transistor non-volatile memory cells.

Electronic system 542 includes an external processor 558, e.g., a memory controller or host processor, electrically connected to memory device 542 for memory accessing. The memory device 542 receives control signals from the processor 558 over a control link 560. The memory cells are used to store data that are accessed via a data (DQ) link 562. Address signals are received via an address link 564 that are decoded at address decoder 546 to access the memory array 544. Address buffer circuit 556 latches the address signals. The memory cells are accessed in response to the control signals and the address signals.

The control link 560, data link 562 and address link 564 can be collectively referred to as access lines. It will be appreciated by those skilled in the art that additional circuitry and control signals can be provided, and that the memory device detail of FIG. 5 has been reduced to facilitate ease of illustration. As stated herein, the basic flash memory device 540 has been simplified to facilitate a basic understanding of the features of the memory device. A more detailed understanding of flash memories is known to those skilled in the art. As is well known, such basic flash memory device 540 may be fabricated as integrated circuits on a semiconductor substrate. The memory cells described above are used in various embodiments in the basic memory array or system structure described in FIG. 5.

CONCLUSION

Memory cell structures and methods of fabrication have been described that include forming a nanorod floating gate to facilitate increased coupling area and a reduction in parasitic capacitance leading to improved gate coupling characteristics.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A memory cell, comprising:
    a tunnel dielectric layer overlying a semiconductor substrate;
    a floating gate having a conductive first layer overlying the tunnel dielectric layer and a conductive nanorod having a longest dimension extending from the conductive first layer in an approximately perpendicular direction relative to the surface of the tunnel dielectric layer; and
    a control gate layer separated from the floating gate by an intergate dielectric layer.

2. The memory cell of claim 1, where the conductive nanorod grows in length atop the conductive first layer so that the conductive nanorod extends from the conductive first layer at approximately a ninety degree angle relative to the surface of the tunnel dielectric layer.

3. The memory cell of claim 1, where the conductive nanorod has a width of approximately five (5) nm.

4. The memory cell of claim 1, where the conductive nanorod has a height of approximately fifty (50) to two hundred (200) nm.

5. The memory cell of claim 1, where the conductive first layer and the conductive nanorod are formed of the same material.

6. The memory cell of claim 2, where the floating gate has a height in a range of seventy (70) nm to two hundred twenty (220) nm.

7. A memory cell, comprising:
    a tunnel dielectric layer overlying a semiconductor substrate and interposed between first and second isolation regions;
    a floating gate having a conductive first layer overlying the tunnel dielectric layer and a conductive nanorod having a longest dimension extending from the conductive first layer in an approximately perpendicular direction relative to the surface of the tunnel dielectric layer, where the conductive first layer extends above the first and second isolation regions; and a control gate layer separated from the floating gate by an intergate dielectric layer overlying the floating gate.

8. The memory cell of claim 7, where the tunnel dielectric layer has a thickness of approximately ten (10) nanometers (nm) or less.

9. The memory cell of claim 7, where the conductive nanorod extends from the conductive first layer in an approximately perpendicular direction relative to the first layer.

10. The memory cell of claim 9, where the conductive nanorod has a height in a range of fifty (50) to two hundred (200) nm.

11. The memory cell of claim 7, where the conductive first layer extends above the first and second isolation regions by at least approximately fifteen (15) nm.

12. A memory cell, comprising:
a tunnel dielectric layer overlying a semiconductor substrate and interposed between first and second isolation regions;
a floating gate having a conductive first layer overlying the tunnel dielectric layer and a conductive nanorod having a longest dimension extending from the conductive first layer in an approximately perpendicular direction relative to the surface of the tunnel dielectric layer, where the first and second isolation regions extend above the conductive first layer; and
a control gate layer separated from the floating gate by an intergate dielectric layer.

13. The memory cell of claim 12, including spacers on sidewalls of the first isolation region and the second isolation region.

14. The memory cell of claim 13, where the spacers have a width equal to approximately fifteen (15) nm.

15. The memory cell of claim 12, where the first and second isolation regions extend above the conductive first layer by at least approximately twenty (20) nm.

16. The memory cell of claim 15, where the first and second isolation regions have a total height approximately equal to thirty five (35) nm.

17. The memory cell of claim 12, where the conductive first layer has a height approximately equal to twenty (20) nm.

18. A memory device, comprising:
an array of memory cells arranged in rows coupled by word lines and columns coupled by bit lines; and
a circuitry for control and/or access of the array of memory cells;
wherein at least one memory cell of the array of memory cells includes:
a tunnel dielectric layer overlying a semiconductor substrate;
a floating gate having a conductive first layer overlying the tunnel dielectric layer and a conductive nanorod having a longest dimension extending from the conductive first layer in an approximately perpendicular direction relative to the surface of the tunnel dielectric layer; and
a control gate layer separated from the floating gate by an intergate dielectric layer overlying the floating gate.

19. An electronic system, comprising:
a processor; and
a memory device coupled to the processor, where the memory device includes:
an array of memory cells, at least one memory cell including:
a tunnel dielectric layer overlying a semiconductor substrate;
a floating gate having a conductive first layer overlying the tunnel dielectric layer and a conductive nanorod having a longest dimension extending from the conductive first layer in an approximately perpendicular direction relative to the surface of the tunnel dielectric layer; and
a control gate layer separated from the floating gate by an integrate dielectric layer overlying the floating gate; and
a circuitry for control and/or access of the array of memory cells.

* * * * *

UNITED STATES PATENT AND TRADEMARK OFFICE
CERTIFICATE OF CORRECTION

PATENT NO. : 7,667,260 B2  Page 1 of 1
APPLICATION NO. : 11/501525
DATED : February 23, 2010
INVENTOR(S) : Gurtej S. Sandhu et al.

It is certified that error appears in the above-identified patent and that said Letters Patent is hereby corrected as shown below:

In column 12, line 36, in Claim 19, delete "integrate" and insert -- intergate --, therefor.

Signed and Sealed this

Eighteenth Day of May, 2010

David J. Kappos
*Director of the United States Patent and Trademark Office*